(12) United States Patent
Arai

(10) Patent No.: US 6,433,606 B1
(45) Date of Patent: Aug. 13, 2002

(54) CLOCK DRIVER CIRCUIT AND METHOD OF ROUTING CLOCK INTERCONNECTIONS

(75) Inventor: Kenji Arai, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 25 days.

(21) Appl. No.: 09/633,858

(22) Filed: Aug. 7, 2000

(30) Foreign Application Priority Data

Feb. 17, 2000 (JP) ...................................... 2000-039303

(51) Int. Cl.$^7$ ................................................ H03K 3/00
(52) U.S. Cl. ......................... 327/291; 327/292; 327/294
(58) Field of Search .............................. 326/30, 86, 90, 326/319, 333; 327/74, 333, 379, 108, 563, 510, 291, 292, 293, 295, 296, 505

(56) References Cited

U.S. PATENT DOCUMENTS

| | | | | |
|---|---|---|---|---|
| 5,539,333 A | * | 7/1996 | Cao et al. ....................... | 326/63 |
| 5,666,302 A | * | 9/1997 | Tanaka et al. ................ | 364/825 |
| 5,959,492 A | * | 9/1999 | Khoury et al. ............... | 327/389 |
| 6,070,211 A | * | 5/2000 | Neal et al. .................... | 710/106 |
| 6,208,161 B1 | * | 3/2001 | Suda ............................. | 326/30 |

FOREIGN PATENT DOCUMENTS

| | | |
|---|---|---|
| JP | 07183778 | 7/1995 |
| JP | 11003945 | 1/1999 |

* cited by examiner

*Primary Examiner*—Tuan T. Lam
*Assistant Examiner*—Hiep Nguyen
(74) *Attorney, Agent, or Firm*—Venable; Michael A. Sartori

(57) ABSTRACT

Disclosed herein are a clock driver circuit and a method of routing clock interconnect lines, which control the lengths of adjacent interconnect lines and ununiformity of conductive line capacitance due to the intersection of interlayer interconnect lines, thereby reducing clock skews. The clock driver circuit comprises an input terminal to which a single-phase clock signal is inputted, an initial-stage clock driver circuit which is connected to the input terminal and which converts the single-phase clock signal to positive-phase and anti-phase clock signals, an intermediate clock driver circuits which respectively relay the positive-phase and anti-phase clock signals outputted from the initial-stage clock driver circuit, a final-stage clock driver circuits which respectively convert the positive-phase and anti-phase clock signals relayed by the intermediate clock driver circuits to single-phase clock signals, and a pair of interconnect lines which respectively connect between the initial-stage clock driver circuit and the final-stage clock driver circuits through the intermediate clock driver circuits and transmit positive-phase and anti-phase clock signals. The interconnect lines are placed as adjacent to each other.

23 Claims, 12 Drawing Sheets

CLOCK DRIVER CIRCUIT AND METHOD OF ROUTING CLOCK INTERCONNECTIONS

BACKGROUND OF THE INVENTION

The present invention relates to a clock driver circuit suitable for use in a semiconductor integrated circuit and a method of lay out or routing clock interconnections, and particularly to a clock driver circuit capable of reducing clock skews and a method of routing clock interconnections.

A clock signal has normally been used in a semiconductor integrated circuit to provide synchronization of internal operations. In such a case, clock driver circuits and clock interconnect lines used to distribute a clock signal generated from a clock signal generator lying within the semiconductor integrated circuit or an externally input clock signal to the entire circuit blocks in the semiconductor integrated circuit are commonly provided within the semiconductor integrated circuit.

In a semiconductor integrated circuit required to provide synchronization based on a clock signal, clock interconnect lines are determined according to physical placement of clock driver circuits to which a clock is distributed. Therefore, the lengths of the clock interconnect lines up to their corresponding circuit blocks are unbalanced and hence variations in a conductive line load might occur. As a result, the difference in delay between each individual clock driver circuits occurs and hence a difference occurs between time intervals required to propagate the clock signal to each individual circuit blocks. This will be called "clock skew". This clock skew might produce a circuit malfunction called "racing". It is thus necessary to reduce the clock skew from the viewpoint of the design of the semiconductor integrated circuit.

As the semiconductor integrated circuit which aims to reduce such a clock skew, there is known one disclosed in, for example, Japanese Patent Application Laid-Open No. Hei 7-183778. In a method of routing or lay out clock interconnect lines, which has been disclosed herein, adjacent interconnect lines are set to a conductive line prohibition regions when the clock interconnect lines are formed after the placement of cells used as circuit blocks. Thereafter, paths for the clock interconnect lines are specified so that the distances over which the clock interconnect lines extend from clock drivers to the respective cells, become identical. After the completion of their conductive line, the capacitances of the clock interconnect lines are simulated and the unbalance between the lengths of the clock interconnect lines is calculated. S-shaped additional interconnect lines are formed to equalize the lengths of the clock interconnect lines in each individual systems each other through the use of the conductive line prohibition regions according to the result of calculation. The conductive line capacitances are rendered uniform under the use of the additional interconnect lines, thereby achieving a reduction in clock skew.

Further, Japanese Patent Application Laid-Open No. Hei 11-3945 discloses a clock-tree designing method capable of reducing skews between a plurality of clock signals different in system from each other in a semiconductor integrated circuit activated in synchronism with the plurality of clock signals. According to such a designing method, the clock signals are transmitted through the use of clock buffer cells each having two input terminals to which the two-system clock signals are respectively inputted, and their corresponding two output terminals. Described specifically, two-system clock trees are formed for two clock signals outputted from output terminals of one clock buffer. Two clock signal wires or interconnect lines are wired or routed substantially in parallel through the clock buffer cells as viewed from clock pads to which the clock signals are inputted. Therefore, the lengths of each individual clock signal interconnect lines become equal so that the skews can be reduced.

However, the clock interconnect line routing or lay out method for the semiconductor integrated circuit, which has been described in Japanese Patent Application Laid-Open No. Hei 7-183778 does not take into consideration the clock skews developed due to ununiformity of conductive line capacitance having allowed for the capacitance between the adjacent interconnect lines, conductive line capacitance developed due to the intersection of lower or upper interconnect lines, etc. Further, a problem arises in that since the layout of the clock interconnect lines is determined once and conductive line is modified again after simulation, working time increases.

Further, the clock interconnect line routing method for the semiconductor integrated circuit, which has been described in Japanese Patent Application Laid-Open No. Hei 11-3945, has the merit that since the clock interconnect lines different in system are respectively routed adjacent to one another in advance, a change in adjacent capacitance is low and the skew developed due to it can be reduced. However, the clock interconnect line routing method does not take into consideration control on clock skews based on ununiformity of conductive line capacitance due to the intersection of interlayer interconnect lines. Therefore, a problem arises in that when the ununiformity of conductive line capacitance due to the intersection of the interlayer interconnect lines is high, the significant modification of interconnect lines is required and hence working time increases.

SUMMARY OF THE INVENTION

With the foregoing problems in view, it is therefore an object of the present invention to provide a clock driver circuit and a method of routing clock interconnect lines, which are capable of controlling the lengths of adjacent interconnect lines and ununiformity of conductive line capacitance due to the intersection of interlayer interconnect lines.

A clock driver circuit according to the present invention comprises an input terminal to which a single-phase clock signal is inputted, an initial-stage clock driver circuit electrically connected to the input terminal, for converting the single-phase clock signal to positive-phase and anti-phase clock signals, an intermediate clock driver circuit for relaying the positive-phase and anti-phase clock signals outputted from the initial-stage clock driver circuit, a final-stage clock driver circuit for converting the positive-phase and anti-phase clock signals relayed by the intermediate clock driver circuit to a single-phase clock signal, and a pair of interconnect lines for connecting between the initial-stage clock driver circuit and the final-stage clock driver circuit through the intermediate clock driver circuit and transmitting the positive-phase and anti-phase clock signals. The interconnect lines are placed as adjacent to each other.

Typical ones of various inventions of the present application have been shown in brief. However, the various inventions of the present application and specific configurations of these inventions will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
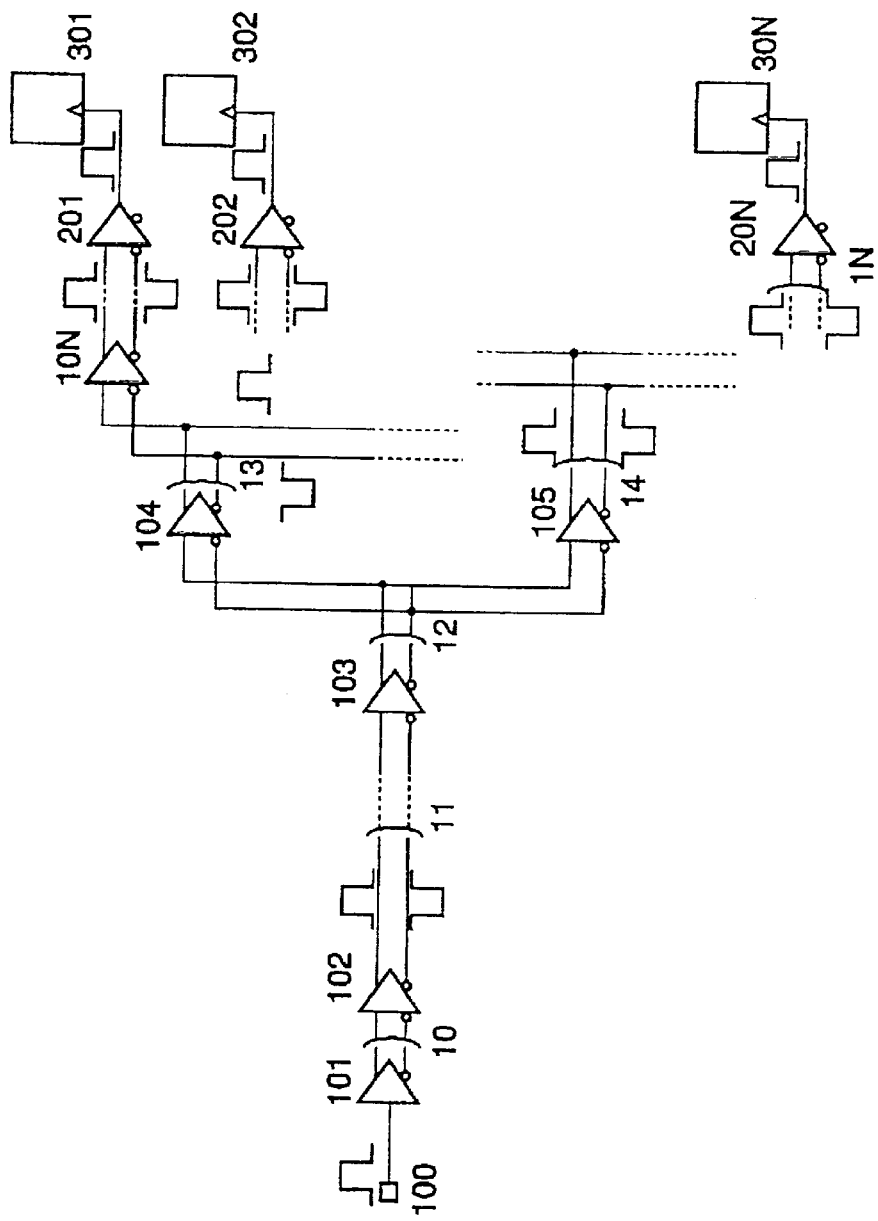
FIG. 1 is a simplified circuit diagram showing a clock driver circuit according to a first embodiment of the present invention.

FIG. 1 is a simplified circuit diagram showing a clock driver circuit according to a first embodiment of the present invention. A clock input terminal 100 is electrically connected to an input terminal of a clock driver circuit 101. The clock driver circuit 101 has, although described in detail later, one input terminal and two output terminals. The clock driver circuit 101 converts an input clock signal to two clock signals having a positive phase and an anti-phase and outputs them therefrom. Two clock wires or interconnect lines 10 are electrically connected to the two output terminals of the clock driver circuit 101. The clock interconnect lines 10 are electrically connected to their corresponding two input terminals of a clock driver circuit 102. Clock driver circuits 102, 103, . . . 10N respectively have two input terminals and two output terminals and respectively output the input positive-phase and anti-phase clock signals as two positive-phase and anti-phase clock signals.

The output terminals of the clock driver circuit 102 are respectively electrically connected to two clock interconnect lines 11, which in turn are respectively electrically connected to two input terminals of the clock driver circuit 103. Subsequently, clock interconnect lines 12, 13, . . . 1N are electrically connected to their corresponding clock driver circuits 103, 104, . . . 10N, 20N.

Clock driver circuits 201, 202, . . . 20N each corresponding to a final stage have two input terminals and one output terminals respectively. They convert two input positive-phase and anti-phase clock signals to positive-phase clock signals and output them therefrom, respectively. Output terminals of the clock driver circuits 201, 202, . . . 20N each corresponding to the final stage are electrically connected to their corresponding clock input units of logical element blocks 301, 302, . . . 30N.

Figure 2:
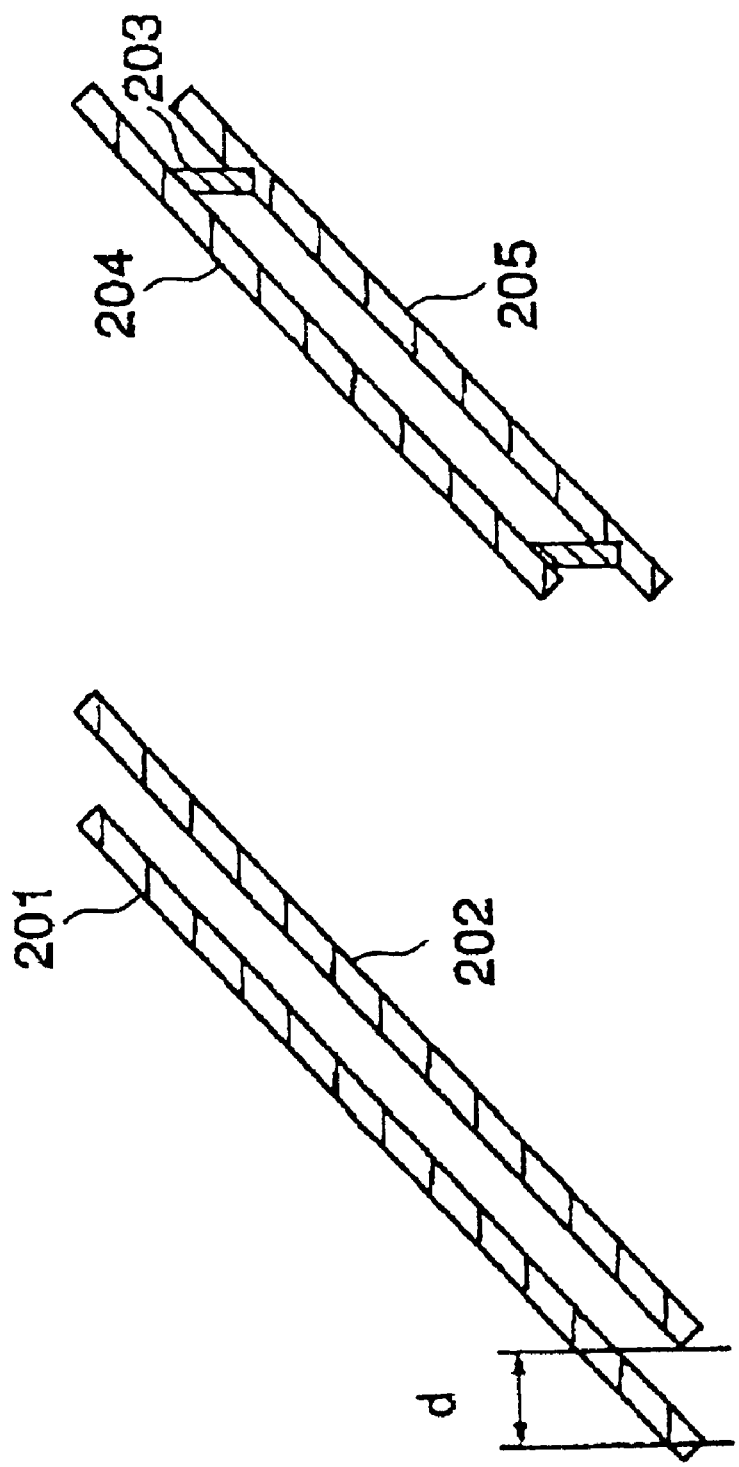
FIG. 2 is a diagram illustrating two interconnect lines routed as adjacent to each other as possible.

Here, the two clock interconnect lines 10, 11, . . . 1N are formed as follows. As shown in FIG. 2(a), two interconnect lines 201 and 202 are formed with or by the same layer so as to adjoin each other at as small conductive line intervals d as possible. Alternatively, two interconnect lines 204 and 205 are formed at substantially the same positions with or by upper and lower layers with insulating layers 203 interposed therebetween, as shown in FIG. 2(b). Further, the two clock interconnect lines 10, 11, . . . 1N may be formed with a balanced tree type such as an H-tree structure as shown in FIG. 1. As an alternative to it, they may be formed with some of them as the combines use of a trunk type and a bus type.

The operation of the semiconductor integrated circuit shown in FIG. 1 will next be described. A clock signal inputted from outside the semiconductor integrated circuit or generated inside the semiconductor integrated circuit is inputted to the input terminal 100. The input clock signal is converted to two positive-phase and anti-phase clock signals by the clock driver circuit 101 (corresponding to a first-stage clock driver in the present embodiment). The two positive-phase and anti-phase clock signals are respectively outputted and transmitted to the two clock interconnect lines 10, followed by input to the clock driver circuit 102 corresponding to a next stage.

The next-stage clock driver circuit 102 (corresponding to an intermediate clock driver in the present embodiment) has the two input terminals for the positive-phase and anti-phase inputs. The input positive-phase and anti-phase clock signals are respectively outputted and transmitted from the two output terminals for the positive-phase and anti-phase outputs of the clock driver circuit 102 to the two clock interconnect lines 11 with given delay times. Further, they are inputted to the next-stage clock driver circuit 103 (corresponding to the intermediate clock driver in the present embodiment). The clock driver circuit 103 also has the two input terminals for the positive-phase and anti-phase inputs. Similarly, the positive-phase and anti-phase clock signals are transmitted to the clock driver circuits 104, 105, . . . 10N (each corresponding to the intermediate clock driver in the present embodiment) and the final-stage clock driver circuits 201, 202, . . . 20N. The final-stage clock driver circuit 201, 202, . . . 20N respectively electrically connected to the clock inputs of the logical element blocks 301, 302, . . . 30N receive the positive-phase and anti-phase clock signals therein respectively and supply only the positive-phase clock signals to their corresponding logical element blocks.

Figure 3:
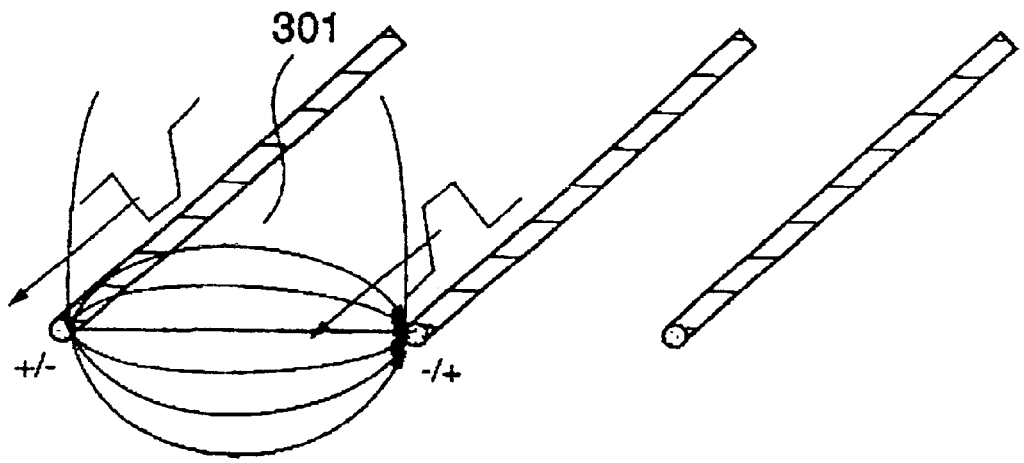
FIG. 3 is a diagram depicting the coupling of electromagnetic fields.
Figure 3:
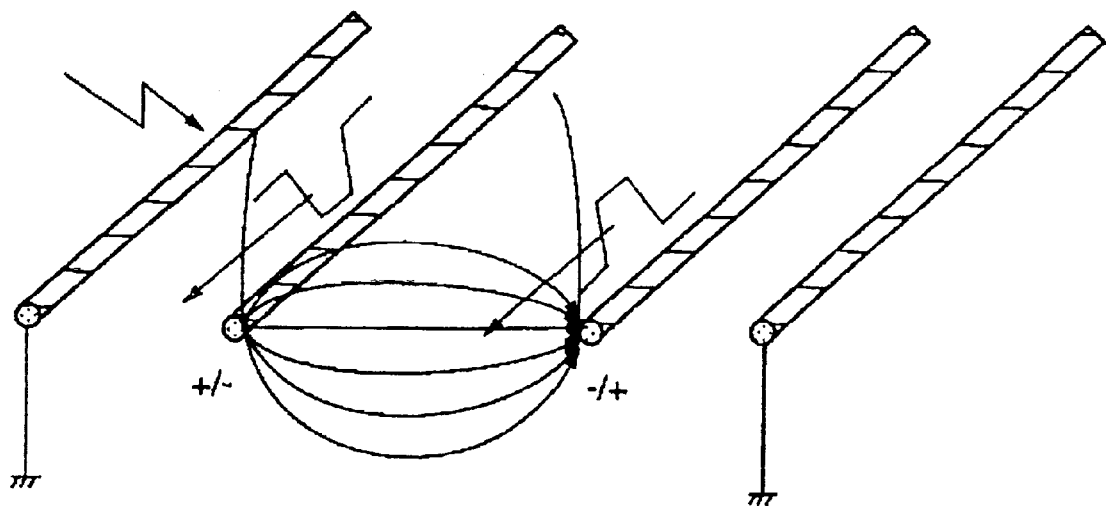

In the first embodiment as described above, the two interconnect lines are respectively laid out or routed as adjacent to one another as possible in advance as shown in FIGS. 2(a) and 2(b). Thus, even when the placement of the clock interconnect lines is determined and thereafter other interconnect lines are modified and positioned close to the clock interconnect lines, there is a merit in reducing a change in the capacitance of each clock interconnect line. Since the positive-phase and anti-phase clock signals propagate through the adjacent two interconnect lines, the coupling of an electromagnetic field 301 shown in FIG. 3(a)

occurs therebetween. Thus, the influence of other interconnect lines placed close to each other is reduced as compared with the case in which the two interconnect lines are simply routed adjacent to each other. While the two clock interconnect lines employed in the first embodiment are routed as adjacent to each other as possible, interconnect lines connected to a predetermined potential or grounded as shields may be placed on both sides of the two interconnect lines. The interconnect lines on both sides thereof bring about the effect of suppressing external noise as the shields. Further, an effect is brought about even in the case of control on a change in load capacitance of each clock interconnect line due to the adjoining routing of other interconnect lines.

There was conventionally a case in which when the layout of the clock interconnect lines was determined in advance prior to the conductive line layout of the entire semiconductor integrated circuit, variations in load capacitance of the clock interconnect lines would occur due to the influence of other interconnect lines after the entire conductive line layout. According to the first embodiment, the two clock interconnect lines through which the positive-phase and anti-phase clock signals propagate, are placed as close to each other as possible. Accordingly, the capacitance of such two clock interconnect lines become dominant as the capacitance of the clock interconnect lines, and the influence of other interconnect lines is low. Thus, the estimation of skews resultant from the clock interconnect lines preceding the conductive line layout of the entire semiconductor integrated circuit is substantially identical to that subsequent to the conductive line layout of the entire semiconductor integrated circuit.

Further, the clock interconnect lines employed in the first embodiment can be easily designed and implemented over a gate array, an embedded array or a cell base system by a CAD system.

FIGS. 4(a), 4(b) and 4(c) are respectively partly block diagrams showing clock driver circuits each related to a second embodiment of the present invention. Incidentally, since the entire clock driver circuits are identical to the circuits of FIG. 1 described in the aforementioned first embodiment, the description thereof will therefore be omitted.

FIG. 4(a) is a block diagram of a one-input and two-output clock driver circuit used as the first-stage clock driver 101 in the first embodiment shown in FIG. 1. In FIG. 4(a), a full-amplitude single-phase clock signal, which varies over an amplitude range of, for example, from 0V used as a ground potential Gnd to 3.3V used as a source potential Vdd, is inputted to a clock input terminal A. The input full-amplitude single-phase clock signal is sent to a clock signal receiving unit 401. The clock signal receiving unit 401 converts the full-amplitude single-phase clock signal to small-amplitude positive-phase and anti-phase clock signals which are smaller in magnitude (vary in amplitude between 0.55V and 0.8V, for example) and outputs them therefrom. The positive-phase and anti-phase small-amplitude clock signals are transmitted to a clock signal transmitting unit 402. The clock signal transmitting unit 402 shapes the transmitted positive-phase and anti-phase small-amplitude clock signals and outputs the so-shaped clock signals from two output terminals Y and YN. As a result, the full-amplitude single-phase clock signal is outputted as the positive-phase and anti-phase small-amplitude clock signals with a predetermined delay.

FIG. 4(b) is a block diagram of a two-input and two-output clock driver circuit (represented as a clock driver circuit 102 in FIG. 4(b)) used as each of the second-stage to the pre-final stage clock drivers 102 through 10N in the first embodiment shown in FIG. 1. Positive-phase and anti-phase small-amplitude clock signals are inputted to two clock input terminals A and AN respectively. The input positive-phase and anti-phase small-amplitude clock signals are sent to a clock signal receiving unit 403. The clock signal receiving unit 403 shapes the positive-phase and anti-phase small-amplitude clock signals and outputs them therefrom. The positive-phase and anti-phase small-amplitude clock signals are sent to a clock signal transmitting unit 404. The clock signal transmitting unit 404 shapes the transmitted positive-phase and anti-phase small-amplitude clock signals and outputs the so-shaped clock signals from two output terminals Y and YN respectively. As a result, the positive-phase and anti-phase small-amplitude clock signals are outputted with predetermined delays.

FIG. 4(c) is a block diagram of a two-input and one-output clock driver circuit (represented as a clock driver circuit 201 in FIG. 4(c)) used as each of the final-stage clock drivers 201 through 20N in the first embodiment shown in FIG. 1. In FIG. 4(c), positive-phase and anti-phase small-amplitude clock signals are inputted to two clock input terminals A and AN. The input positive-phase and anti-phase small-amplitude clock signals are sent to a clock signal receiving unit 405. The clock signal receiving unit 405 shapes the positive-phase and anti-phase small-amplitude clock signals and outputs the so-shaped clock signals therefrom. The positive-phase and anti-phase small-amplitude clock signals are transmitted to a clock signal transmitting unit 406. The clock signal transmitting unit 406 amplifies the transmitted positive-phase and anti-phase small-amplitude clock signals, extracts either one of the so-processed positive-phase and anti-phase clock signals, and outputs it therefrom as a full-amplitude single-phase clock signal. As a result, the positive-phase and anti-phase small-amplitude clock signals are outputted as the full-amplitude single-phase clock signal with a predetermined delay.

Figure 4:
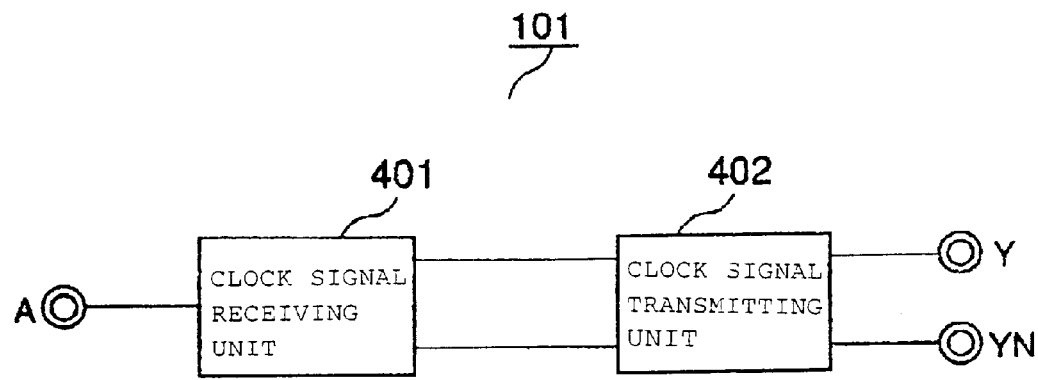
FIG. 4 is a partly block diagram showing clock driver circuits each concerned with a second embodiment of the present invention.
Figure 4:
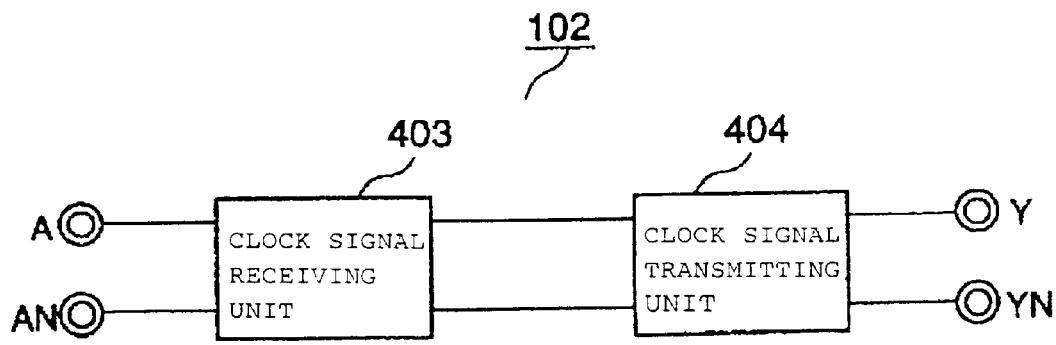
Figure 4:
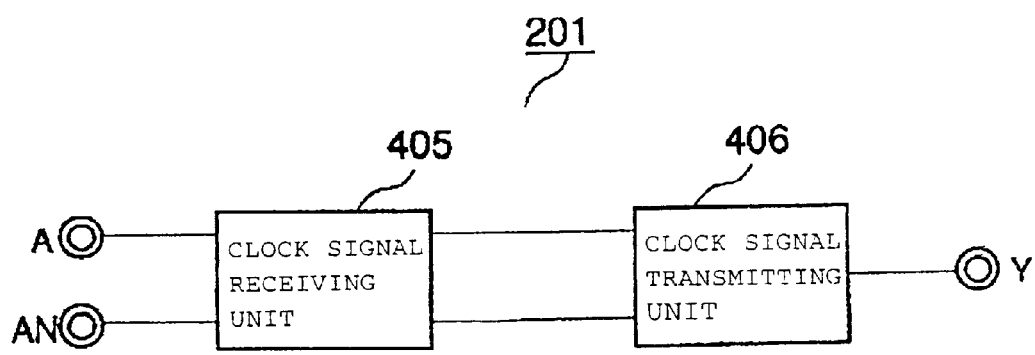
Figure 5:
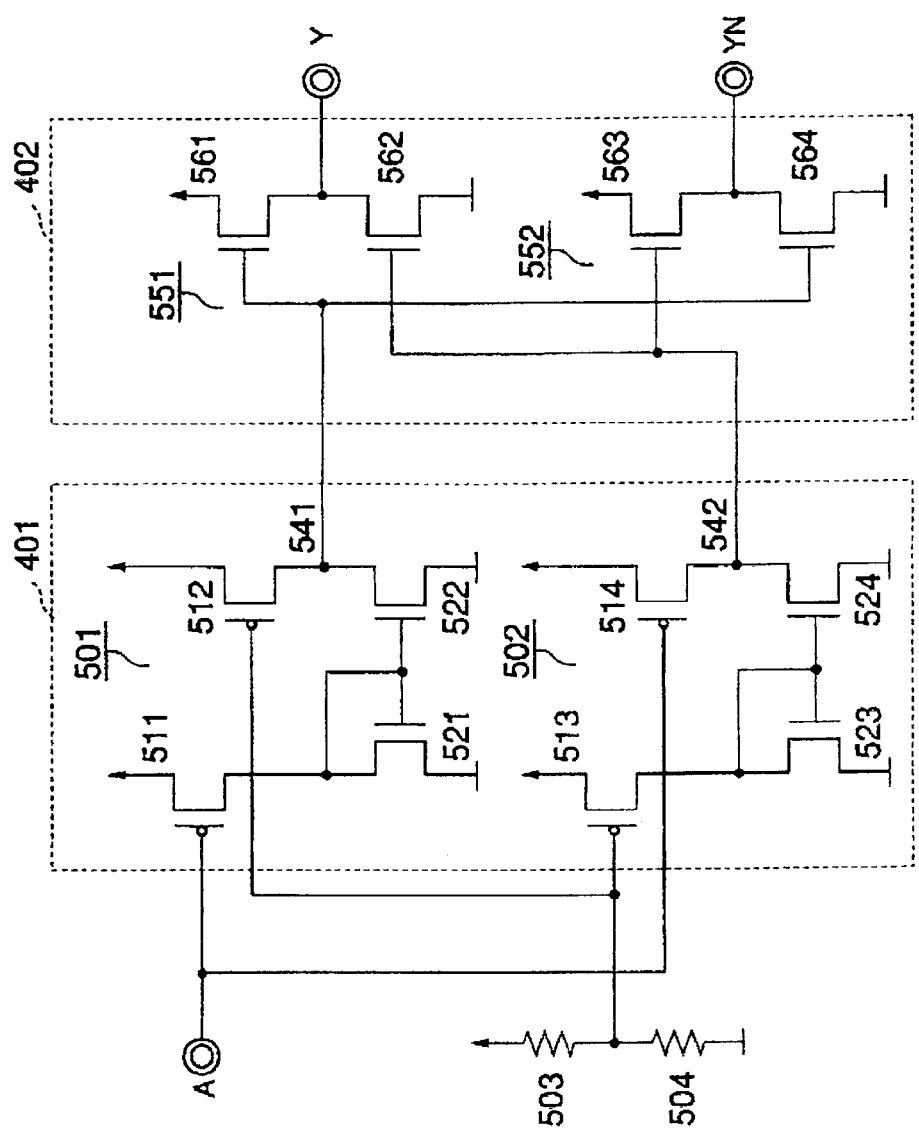
FIG. 5 is a diagram illustrating a circuit configuration of the clock driver circuit shown in FIG. 4(a)

FIG. 5 is a diagram showing a circuit configuration of the clock driver circuit 101 shown in FIG. 4(a). In FIG. 5, the clock signal receiving unit 401 has first and second differential amplifier circuits 510 and 502. The first differential amplifier circuit 501 comprises first and second PMOS transistors 511 and 512 and first and second NMOS transistors 521 and 522. The sources of the first and second PMOS transistors 511 and 512 are respectively supplied with a source potential. The sources of the first and second NMOS transistors 521 and 522 are respectively supplied with a ground potential. The gates of the first and second NMOS transistors 521 and 522 are electrically connected in common. Further, the gates thereof are electrically connected in common with the drains of the first PMOS transistor 511 and the first NMOS transistor 521. The drains of the second PMOS transistor 512 and second NMOS transistor 522 are electrically connected in common with a first output node 541 of the clock signal receiving unit 401.

The second differential amplifier circuit 502 comprises third and fourth PMOS transistors 513 and 514 and third and fourth NMOS transistors 523 and 524. The sources of the third and fourth PMOS transistors 513 and 514 are respectively supplied with the source potential. The sources of the third and fourth NMOS transistors 523 and 524 are respectively supplied with the ground potential. The gates of the third and fourth NMOS transistors 523 and 524 are electrically commonly-connected to each other and electrically connected in common with the drains of the third PMOS transistor 513 and the third NMOS transistor 523. The drains of the fourth PMOS transistor 514 and the fourth NMOS transistor 524 are electrically commonly-connected to a second output node 542 of the clock signal receiving unit 401.

The input terminal A to which the single-phase full-amplitude clock signal is inputted, is electrically connected to the gates of the first and fourth PMOS transistors 511 and 514. On the other hand, the gates of the second and third PMOS transistors 512 and 513 are respectively supplied with a reference potential. The reference potential may be set to about one-half the source potential. It is needless to say that while the reference potential is generated by dividing a potential developed between the source potential and the ground with resistors 503 and 504 in FIG. 5, the reference potential may be created by an alternative method.

The clock signal transmitting unit 402 comprises first and second NMOS push-pull circuits 551 and 552. The first NMOS push-pull circuit 551 comprises fifth and sixth NMOS transistors 561 and 562. A first terminal of the fifth NMOS transistor 561 is supplied with the source potential, whereas a first terminal of the sixth NMOS transistor 562 is supplied with the ground potential. Second terminals of the fifth and sixth NMOS transistors 561 and 562 are electrically commonly-connected to the positive-phase output terminal Y. The second NMOS push-pull circuit 552 comprises seventh and eighth NMOS transistors 563 and 564. A first terminal of the seventh NMOS transistor 563 is supplied with the source potential. A first terminal of the eighth NMOS transistor 564 is supplied with the ground potential. Second terminals of the seventh and eighth NMOS transistors 563 and 564 are electrically commonly-connected to the anti-phase output terminal YN. The gates of the fifth and eighth NMOS transistors 561 and 564 are electrically connected to the first output node 541, whereas the gates of the sixth and seventh NMOS transistors 562 and 563 are electrically connected to the second output node 542.

The operation of the clock driver circuit 101 shown in FIG. 5 will next be explained. Incidentally, it will be described with timing provided to vary the full-amplitude single-phase clock signal inputted to the input terminal A from an L level to an H level for convenience of its description.

Since the potential level applied to the input terminal A changes from the L to H levels, the first PMOS transistor 511 and fourth PMOS transistor 514 of the clock signal receiving unit 401 change in an OFF direction (i.e., these PMOS transistors 511 and 514 increase in ON resistance). On the other hand, since the gates of the second and third PMOS transistors 512 and 513 are supplied with the reference potential, no changes occur in these transistors 512 and 513. In the first differential amplifier circuit 501, the potential applied to the gates of the first and second NMOS transistors 521 and 522 becomes low and hence their ON resistance will increase. Therefore, the potential at the first output node 541 slightly rises. While the potential applied to the gates of the third and fourth NMOS transistors 523 and 524 in the second differential amplifier circuit 502 does not change, the fourth PMOS transistor 514 changes in the OFF direction as described above. Therefore, the potential at the second output node 542 is slightly reduced.

As described above, the full-amplitude single-phase clock signal supplied to the input terminal A is converted to small amplitudes. Consequently, a clock signal being in phase with the clock signal supplied to the input terminal is outputted from the first output node 541, whereas a clock signal opposite in phase to the clock signal supplied to the input terminal is outputted from the second output node 542. It is desirable that the potential level of each clock signal brought to the small amplitude is set to the neighborhood of the ground potential (0V) in consideration of current drain or consumption, threshold values of PMOS transistors, etc.

Since the potential at the first output node 541 slightly rises, the fifth and eighth NMOS transistors 561 and 564 of the clock signal transmitting unit 402 decrease in ON resistance. On the other hand, since the potential at the second output node 542 slightly drops, the sixth and seventh NMOS transistors 562 and 563 of the clock signal transmitting unit 402 increase in ON resistance. Therefore, the potential at the positive-phase output terminal Y slightly increases, whereas the potential at the anti-phase output terminal YN is slightly lowered. As a result, a small-amplitude clock signal being in phase with the clock signal supplied to the input terminal is outputted from the positive-phase output terminal Y, whereas a small-amplitude clock signal opposite in phase to the clock signal supplied to the input terminal is outputted form the anti-phase output terminal YN.

Figure 6:
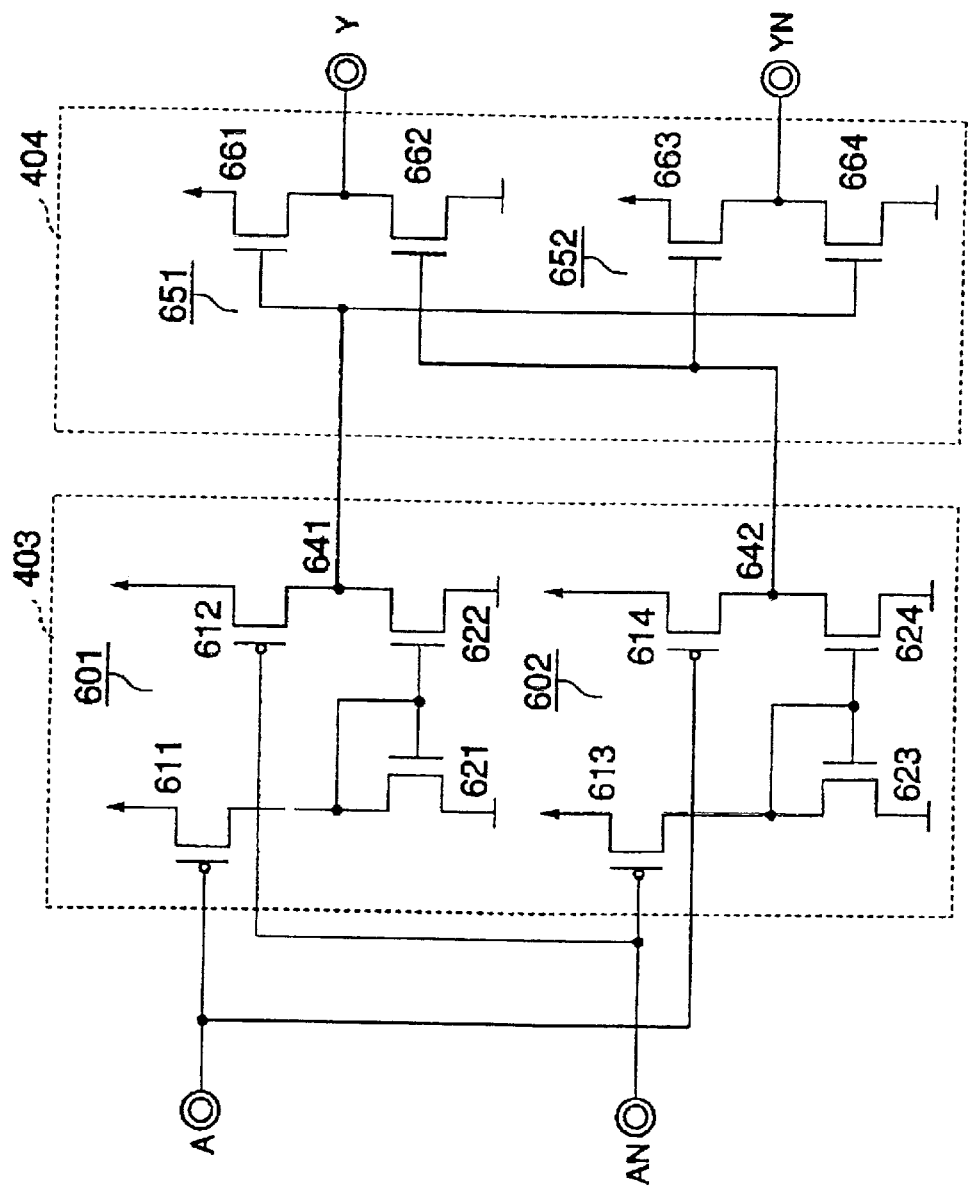
FIG. 6 is a diagram depicting a circuit configuration of the clock driver circuit shown in FIG. 4(b)

FIG. 6 is a diagram showing a circuit configuration of the clock driver circuit 102 shown in FIG. 4(b). In FIG. 6, the clock signal receiving unit 403 has first and second differential amplifier circuits 601 and 602. The first differential amplifier circuit 601 comprises first and second PMOS transistors 611 and 612 and first and second NMOS transistors 621 and 622. The sources of the first and second PMOS transistors 611 and 612 are respectively supplied with a source potential. The sources of the first and second NMOS transistors 621 and 622 are respectively supplied with a ground potential. The gates of the first and second NMOS transistors 621 and 622 are electrically connected in common. Further, the gates thereof are electrically connected in common with the drains of the first PMOS transistor 611 and the first NMOS transistor 621. The drains of the second PMOS transistor 612 and second NMOS transistor 622 are electrically connected in common with a first output node 641 of the clock signal receiving unit 403.

The second differential amplifier circuit 602 comprises third and fourth PMOS transistors 613 and 614 and third and fourth NMOS transistors 623 and 624. The sources of the third and fourth PMOS transistors 613 and 614 are respectively supplied with the source potential. The sources of the third and fourth NMOS transistors 623 and 624 are respectively supplied with the ground potential. The gates of the third and fourth NMOS transistors 623 and 624 are electrically commonly-connected to each other and electrically connected in common with the drains of the third PMOS transistor 613 and the third NMOS transistor 623. The drains of the fourth PMOS transistor 614 and the fourth NMOS transistor 624 are electrically commonly-connected to a second output node 642 of the clock signal receiving unit 403.

The positive-phase input terminal A to which the positive-phase small-amplitude clock signal is inputted, is electrically connected to the gates of the first and fourth PMOS transistors 611 and 614. The anti-phase input terminal AN to which the anti-phase small-amplitude clock signal is inputted, is electrically connected to the gates of the second and third PMOS transistors 612 and 613.

The clock signal transmitting unit 404 comprises first and second NMOS push-pull circuits 651 and 652. The first NMOS push-pull circuit 651 comprises fifth and sixth NMOS transistors 661 and 662. A first terminal of the fifth NMOS transistor 661 is supplied with the source potential, whereas a first terminal of the sixth NMOS transistor 662 is supplied with the ground potential. Second terminals of the fifth and sixth NMOS transistors 661 and 662 are electrically commonly-connected to the positive-phase output terminal Y. The second NMOS push-pull circuit 652 comprises seventh and eighth NMOS transistor 663 and 664. A first terminal of the seventh NMOS transistor 663 is supplied with the source potential. A first terminal of the eighth NMOS transistor 664 is supplied with the ground potential. Second terminals of the seventh and eighth NMOS transistors 663 and 664 are electrically commonly-connected to the anti-phase output terminal YN. The gates of the fifth and eighth NMOS transistors 661 and 664 are electrically connected to the first output node 641, whereas the gates of the sixth and seventh NMOS transistors 662 and 663 are electrically connected to the second output node 642.

The operation of the clock driver circuit 102 shown in FIG. 6 will next be explained. Incidentally, it will be described with timings provided to vary the small-amplitude positive-phase clock signal inputted to the positive-phase input terminal A from an L level to an H level and change the small-amplitude anti-phase clock signal inputted to the anti-phase input terminal AN from the H to L levels for convenience of its description.

Since the potential level applied to the positive-phase input terminal A changes from an L to an H levels in a small-amplitude level, the first PMOS transistor 611 and fourth PMOS transistor 614 of the clock signal receiving unit 403 change in an OFF direction (i.e., these PMOS transistors 611 and 614 increase in ON resistance). On the other hand, since the potential level applied to the anti-phase input terminal AN changes from the H to L levels in the small-amplitude level, the second and third PMOS transistors 612 and 613 change in an ON direction (i.e., these PMOS transistors 612 and 613 decrease in ON resistance).

Since the first PMOS transistor 611 changes in the OFF direction in the first differential amplifier circuit 601, the potential applied to the gates of the first and second NMOS transistors 621 and 622 becomes low and hence these NMOS transistors 621 and 622 increase in ON resistance. Further, the second PMOS transistor 612 changes in the ON direction as described above. Therefore, the potential at he first output node 641 slightly rises.

Since the third PMOS transistor 613 changes in the ON direction in the second differential amplifier circuit 602, the potential applied to the gates of the third and fourth NMOS transistors 623 and 624 rises and hence these NMOS transistors 623 and 624 are reduced in ON resistance. As described above, the fourth PMOS transistor 614 changes in the OFF direction. Therefore, the potential at the second output node 642 is slightly reduced.

As described above, the small-amplitude positive-phase and anti-phase clock signals supplied to the positive-phase input terminal A and anti-phase input terminal AN respectively are outputted from the first output node 641 and the second output node 642 as a positive-phase clock signal and an anti-phase clock signal while they are being held with small amplitude.

Since the potential at the first output node 641 slightly rises, the fifth and eighth NMOS transistors 661 and 664 of the clock signal transmitting unit 404 decrease in ON resistance. On the other hand, since the potential at the second output node 642 slightly drops, the sixth and seventh NMOS transistors 662 and 663 of the clock signal transmitting unit 404 increase in ON resistance. Therefore, the potential at the positive-phase output terminal Y slightly increases, whereas the potential at the anti-phase output terminal YN is slightly lowered. As a result, a positive-phase small-amplitude clock signal is outputted from the positive-phase output terminal Y, whereas an anti-phase small-amplitude clock signal is outputted form the anti-phase output terminal YN.

Figure 7:
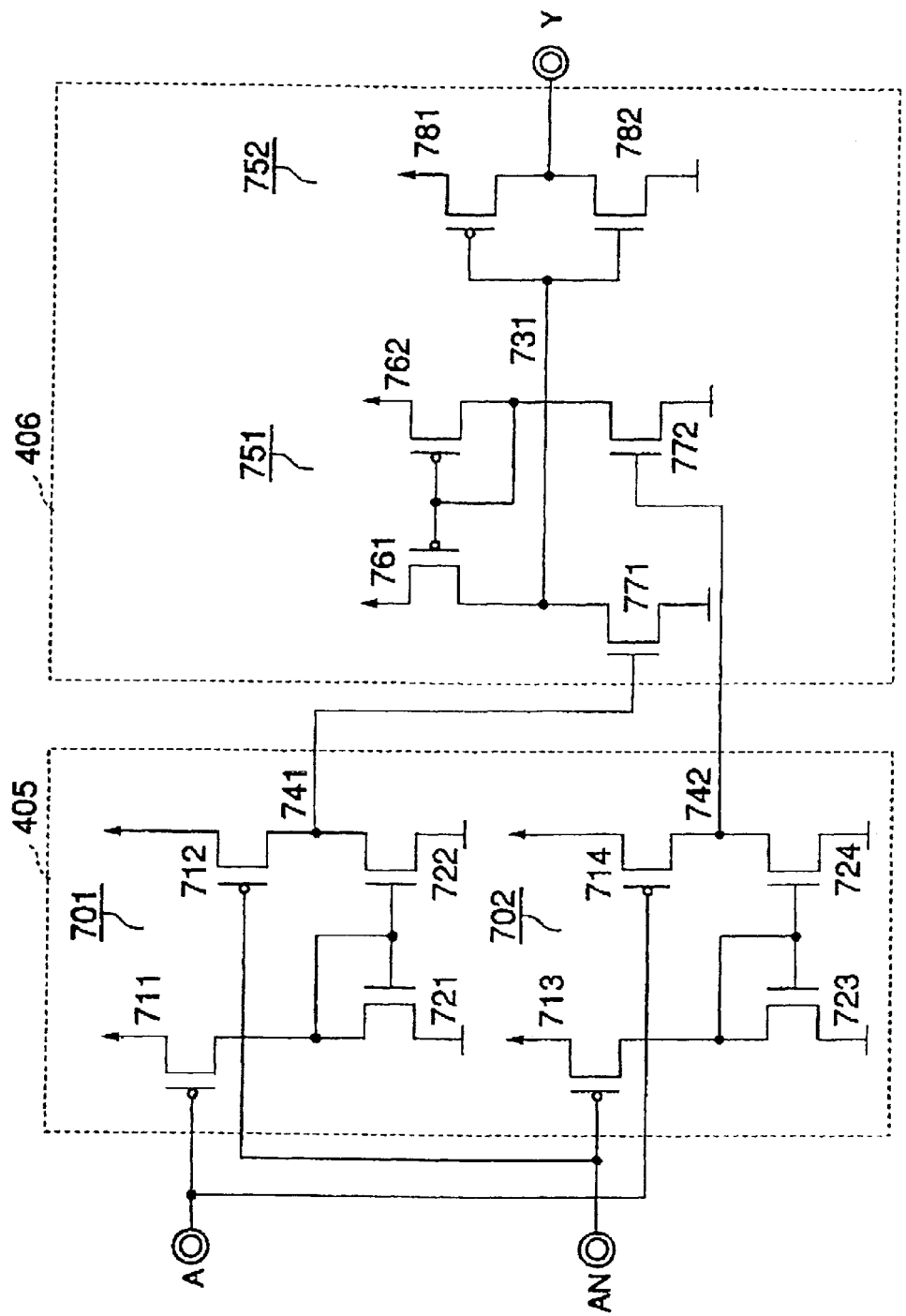
FIG. 7 is a diagram showing a circuit configuration of the clock driver circuit shown in FIG. 4(c)

FIG. 7 is a diagram showing a circuit configuration of the clock driver circuit 201 shown in FIG. 4(c). In FIG. 7, the clock signal receiving unit 405 has first and second differential amplifier circuits 701 and 702. The first differential amplifier circuit 701 comprises first and second PMOS transistors 711 and 712 and first and second NMOS transistors 721 and 722. The sources of the first and second PMOS transistors 711 and 712 are respectively supplied with a source potential. The sources of the first and second NMOS transistors 721 and 722 are respectively supplied with a ground potential. The gates of the first and second NMOS transistors 721 and 722 are electrically connected in common. Further, the gates thereof are electrically connected in common with the drains of the first PMOS transistor 711 and the first NMOS transistor 721. The drains of the second PMOS transistor 712 and second NMOS transistor 722 are electrically connected in common with a first output node 741 of the clock signal receiving unit 405.

The second differential amplifier circuit 702 comprises third and fourth PMOS transistors 713 and 714 and third and fourth NMOS transistors 723 and 724. The sources of the third and fourth PMOS transistors 713 and 714 are respectively supplied with the source potential. The sources of the third and fourth NMOS transistors 723 and 724 are respectively supplied with the ground potential. The gates of the third and fourth NMOS transistors 723 and 724 are electrically commonly-connected to each other and electrically connected in common with the drains of the third PMOS transistor 713 and the third NMOS transistor 723. The drains of the fourth PMOS transistor 714 and the fourth NMOS transistor 724 are electrically commonly-connected to a second output node 742 of the clock signal receiving unit 405.

The positive-phase input terminal A to which the positive-phase small-amplitude clock signal is inputted, is electrically connected to the gates of the first and fourth PMOS transistors 711 and 714. The anti-phase input terminal AN to which the anti-phase small-amplitude clock signal is inputted, is electrically connected to the gates of the second and third PMOS transistors 712 and 713.

The clock signal transmitting unit 406 comprises a third NMOS differential amplifier circuit 751 and an output-stage inverter 752. The third differential amplifier circuit 751 comprises fifth and sixth PMOS transistors 761 and 762 and fifth and sixth NMOS transistors 771 and 772. The sources of the fifth and sixth PMOS transistors 761 and 762 are supplied with the source potential. The sources of the fifth and sixth NMOS transistors 771 and 772 are supplied with the ground potential. The gates of the fifth and sixth PMOS transistors 761 and 762 are electrically commonly-connected to each other and electrically connected in common with the drains of the sixth NMOS transistor 772 and the sixth PMOS transistor 762. The drains of the fifth PMOS transistor 761 and the fifth NMOS transistor 771 are electrically commonly-connected to a third output node 731. The gate of the fifth NMOS transistor 771 is electrically connected to the first output node 741, and the gate of the sixth NMOS transistor 772 is electrically connected to the second output node 742.

The output-stage inverter 752 comprises a seventh PMOS transistor 781 and a seventh NMOS transistor 782. The source of the seventh PMOS transistor 781 is supplied with the source potential, the drain thereof is electrically connected to the output terminal Y, and the gate thereof is electrically connected to the third output node 731. The source of the seventh NMOS transistor 782 is supplied with the ground potential, the drain thereof is electrically connected to the output terminal Y, and the gate thereof is electrically connected to the third output node 731.

The operation of the clock driver circuit 201 shown in FIG. 7 will next be explained. Incidentally, it will be described with timings provided to vary the small-amplitude positive-phase clock signal inputted to the positive-phase input terminal A from an L level to an H level and change the small-amplitude anti-phase clock signal inputted to the anti-phase input terminal AN from the H to L levels for convenience of its description.

Since the potential level applied to the positive-phase input terminal A changes from an L to an H levels in a small-amplitude level, the first PMOS transistor 711 and fourth PMOS transistor 714 of the clock signal receiving unit 405 change in an OFF direction (i.e., these PMOS transistors 711 and 714 increase in ON resistance). On the other hand, since the potential level applied to the anti-phase input terminal AN changes from the H to L levels in the small-amplitude level, the second and third PMOS transistors 712 and 713 change in an ON direction (i.e., these PMOS transistors 712 and 713 decrease in ON resistance).

Since the first PMOS transistor 711 changes in the OFF direction in the first differential amplifier circuit 701, the potential applied to the gates of the first and second NMOS transistors 721 and 722 becomes low and hence these NMOS transistors 721 and 722 increase in ON resistance. Further, the second PMOS transistor 712 changes in the ON direction as described above. Therefore, the potential at the first output node 741 slightly rises.

Since the third PMOS transistor 713 changes in the ON direction in the second differential amplifier circuit 702, the potential applied to the gates of the third and fourth NMOS transistors 723 and 724 rises and hence these NMOS transistors 723 and 724 are reduced in ON resistance. As described above, the fourth PMOS transistor 714 changes in the OFF direction. Therefore, the potential at the second output node 742 is slightly reduced.

As described above, the small-amplitude positive-phase and anti-phase clock signals supplied to the positive-phase input terminal A and anti-phase input terminals AN respectively are outputted from the first output node 741 and the second output node 742 as a positive-phase clock signal and an anti-phase clock signal while they are being held with small amplitude.

Since the potential at the first output node 741 slightly rises, the fifth NMOS transistor 771 of the third differential amplifier circuit 751 in the clock signal transmitting unit 406 decrease in ON resistance. On the other hand, since the potential at the second output node 742 slightly drops, the seventh NMOS transistor 772 of the third differential amplifier circuit 751 increase in ON resistance, and the potential applied to the gates of the fifth and sixth PMOS transistors 761 and 762 also rises. Therefore, the potential at the third output node 731 drops. Owing to control on the threshold values and dimensions of the fifth and sixth NMOS transistors 771 and 772, each of the small-amplitude clock signals on the first and second output nodes 741 and 742 can be converted to an anti-phase clock signal having more-amplified amplitude on the third output node 731.

The output-stage inverter 752 inverts the anti-phase clock signal lying on the third output node 731 and outputs the inverted signal to the output terminal Y as a single-phase positive-phase clock signal. Control on the threshold values and dimensions of the seventh PMOS and NMOS transistors 781 and 782 of the output-stage inverter 752 makes it possible to bring the amplitude of the clock signal outputted from the output terminal Y to full amplitude.

Figure 8:
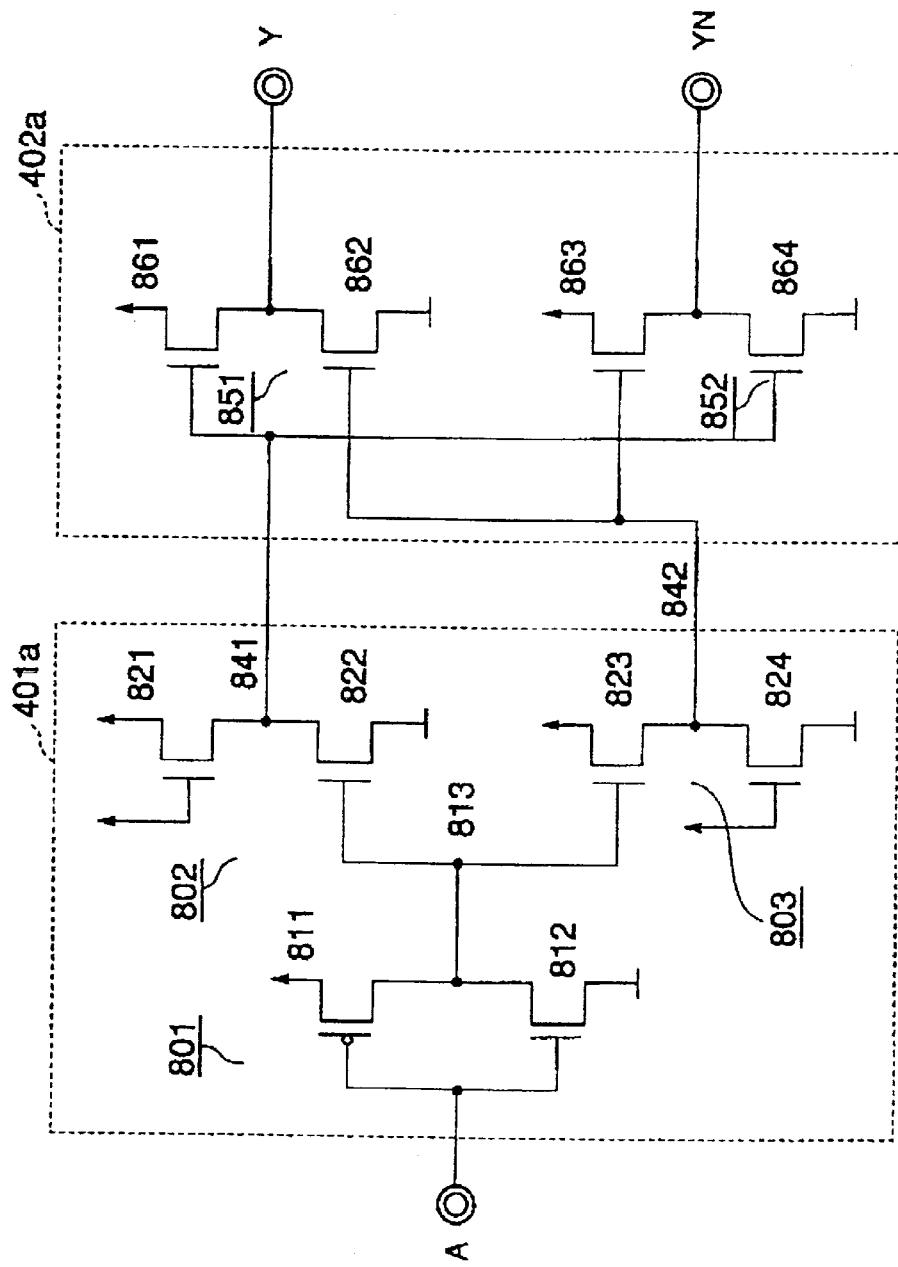
FIG. 8 is a diagram illustrating another circuit configuration of the clock driver circuit 101 shown in FIG. 4(a)

FIG. 8 is a diagram showing another circuit configuration of the clock driver circuit 101 shown in FIG. 4(*a*). In the circuit configuration shown in FIG. 8, a clock driver circuit is comprised of an inverter circuit and NMOS push-pull circuits alone without having to use differential amplifier circuits.

Figure 9:
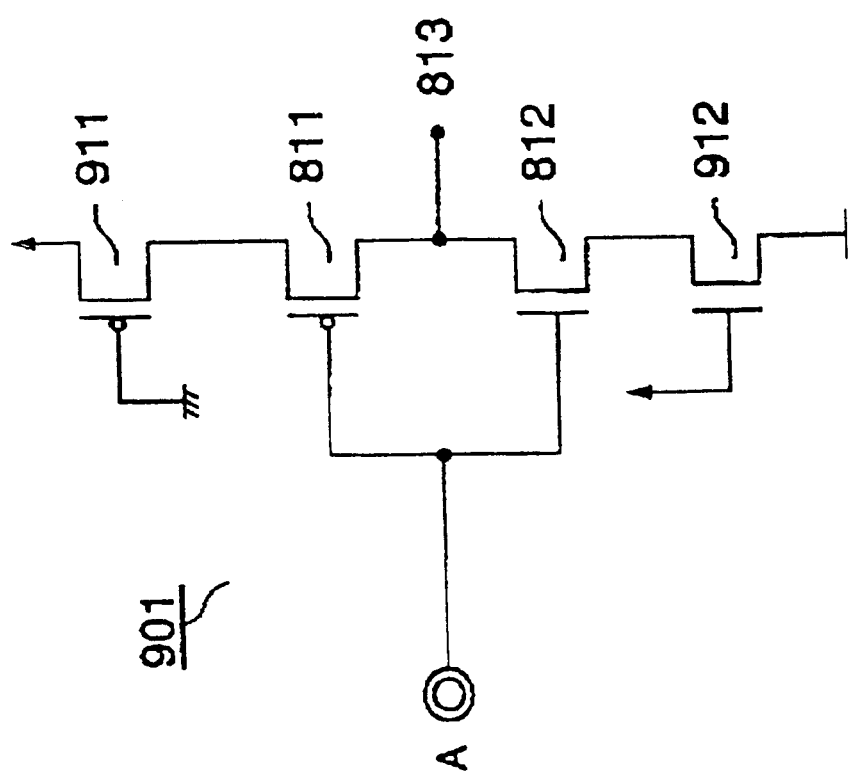
FIG. 9 is a circuit diagram depicting a modification of an input-stage inverter 801 shown in FIG. 8.

Referring to FIG. 8, a clock signal receiving unit 401*a* has an input-stage inverter circuit 801, and first and second push-pull circuits 802 and 803. The input-stage inverter circuit 801 comprises a first PMOS transistor 811 and a first NMOS transistor 812. The input-stage inverter circuit 801 inverts a single-phase full-amplitude clock signal inputted to an input terminal A and outputs the inverted clock signal to a first output node 813. In order to realize a reduction in the amplitude of an anti-phase clock signal developed on the inverter output node 813 in a region close to a source potential, the input-stage inverter circuit 801 is set to a configuration like an inverter circuit 901 wherein a second PMOS transistor 911 and a second NMOS transistor 912 both of which are normally turned ON, are electrically connected in series as shown in FIG. 9 in addition to the first PMOS transistor 811 and the first NMOS transistor 812.

The first NMOS push-pull circuit 802 comprises second and third NMOS transistors 821 and 822. A first terminal of the second NMOS transistor 821 is supplied with a source potential, whereas a first terminal of the third NMOS transistor 822 is supplied with a ground potential. Second terminals of the second and third NMOS transistors 821 and 822 are electrically commonly-connected to a first output node 841. The gate of the second NMOS transistor 821 is supplied with the source potential. The gate of the third NMOS transistor 822 is electrically connected to the output node 813 of the input-stage inverter. The second NMOS push-pull circuit 803 comprises fourth and fifth NMOS transistors 823 and 824. A first terminal of the fourth NMOS transistor 823 is supplied with the source potential, whereas a first terminal of the fifth NMOS transistor 824 is supplied with the ground potential. Second terminals of the fourth and fifth NMOS transistors 823 and 824 are electrically commonly-connected to a second output node 842. The gate of the fourth NMOS transistor 823 is electrically connected to the output node 813 of the input-stage inverter. The gate of the fifth NMOS transistor 824 is supplied with the source potential.

A clock signal transmitting unit 402a comprises third and fourth NMOS push-pull circuits 851 and 852. The third NMOS push-pull circuit 851 comprises sixth and seventh NMOS transistors 861 and 862. A first terminal of the sixth NMOS transistor 861 is supplied with the source potential, whereas a first terminal of the seventh NMOS transistor 862 is supplied with the ground potential. Second terminals of the sixth and seventh NMOS transistors 861 and 862 are electrically commonly-connected to a positive-phase output terminal Y. The fourth NMOS push-pull circuit 852 comprises eighth and ninth NMOS transistors 863 and 864. A first terminal of the eighth NMOS transistor 863 is supplied with the source potential, whereas a first terminal of the ninth NMOS transistor 864 is supplied with the ground potential. Second terminals of the eighth and ninth NMOS transistors 863 and 864 are electrically commonly-connected to an anti-phase output terminal YN. The gates of the sixth and ninth NMOS transistors 861 and 864 are electrically connected to the first output node 841, and the gates of the seventh and eighth NMOS transistors 862 and 863 are electrically connected to the second output node 842.

The operation of the clock driver circuit shown in FIG. 8 will next be described. Incidentally, the operation thereof will be described with timing provided to change the full-amplitude single-phase clock signal inputted to the input terminal A from an L level to an H level for convenience of its description.

Since the potential level applied to the input terminal A change from the L to H levels, the input-stage inverter circuit 801 of the clock signal receiving unit 401a outputs an anti-phase clock signal which changes from the H to L levels, to the inverter output node 813.

Since the gate of the second NMOS transistor 821 of the first NMOS push-pull circuit 802 is supplied with the source potential, the second NMOS transistor 821 is held in an ON state. Since the potential at the inverter output node 813 changes from the H to L levels, the third NMOS transistor 822 changes from an ON state to an OFF state. Therefore, the potential at the second output node 842 rises.

On the other hand, since the gate of the fifth NMOS transistor 824 of the second NMOS push-pull circuit 803 is supplied with the source potential, the fifth NMOS transistor 824 is held in an ON state. Since the potential at the inverter output node 813 changes from the H to L levels, the fourth NMOS transistor 823 changes from the ON state to the OFF state. Therefore, the potential at the first output node 841 drops.

As described above, the full-amplitude single-phase clock signal supplied to the input terminal A is converted to small amplitudes. Consequently, a clock signal being in phase with the clock signal supplied to the input terminal is outputted from the first output node 841, whereas a clock signal opposite in phase to the clock signal supplied to the input terminal is outputted from the second output node 842. It is desirable that the potential level of each clock signal brought to the small amplitude is set to the neighborhood of the ground potential (0V) in consideration of current drain or consumption, threshold values of NMOS transistors, etc.

Since the potential at the first output node 841 rises, the sixth and ninth NMOS transistors 861 and 864 of the clock signal transmitting unit 402a are lowered in ON resistance. On the other hand, since the potential at the second output node 842 slightly drops, the seventh and eighth NMOS transistors 862 and 863 of the clock signal transmitting unit 402a increase in ON resistance. Therefore, the potential at the positive-phase output terminal Y slightly increases, whereas the potential at the anti-phase output terminal YN is slightly lowered. As a result, a small-amplitude clock signal being in phase with the clock signal supplied to the input terminal is outputted from the positive-phase output terminal Y, whereas a small-amplitude clock signal opposite in phase to the clock signal supplied to the input terminal is outputted form the anti-phase output terminal YN.

The configurations in which the two differential amplifier circuits are used in the clock signal receiving units 401, 403 and 405 respectively, have been introduced in the above description. However, each clock signal receiving unit may be constructed of one differential amplifier circuit. Further, the PMOS-reception type circuit system (which receives the signal by each PMOS transistor) has been introduced as the different amplifier circuit. However, if the small-amplitude level of the clock signal is set to a region close to the source side, then an NMOS-reception type circuit system may be used. Further, while the push-pull output circuits have been used in the clock signal transmitting units 402, 402a and 404 respectively, a configuration may also be adopted wherein a small-amplitude differential clock signal is generated using PMOS push-pull circuits, NMOS open drain circuits, CMOS push-pull circuits, differential amplifier circuits, etc.

According to the second embodiment of the present invention as described above, since the clock driver circuit comprised of the clock signal receiving unit and the clock signal transmitting unit capable of transmitting and receiving the small-amplitude clock signals respectively, are used, it is possible to control an increase in skew due to the difference in capacitance.

Figure 10:
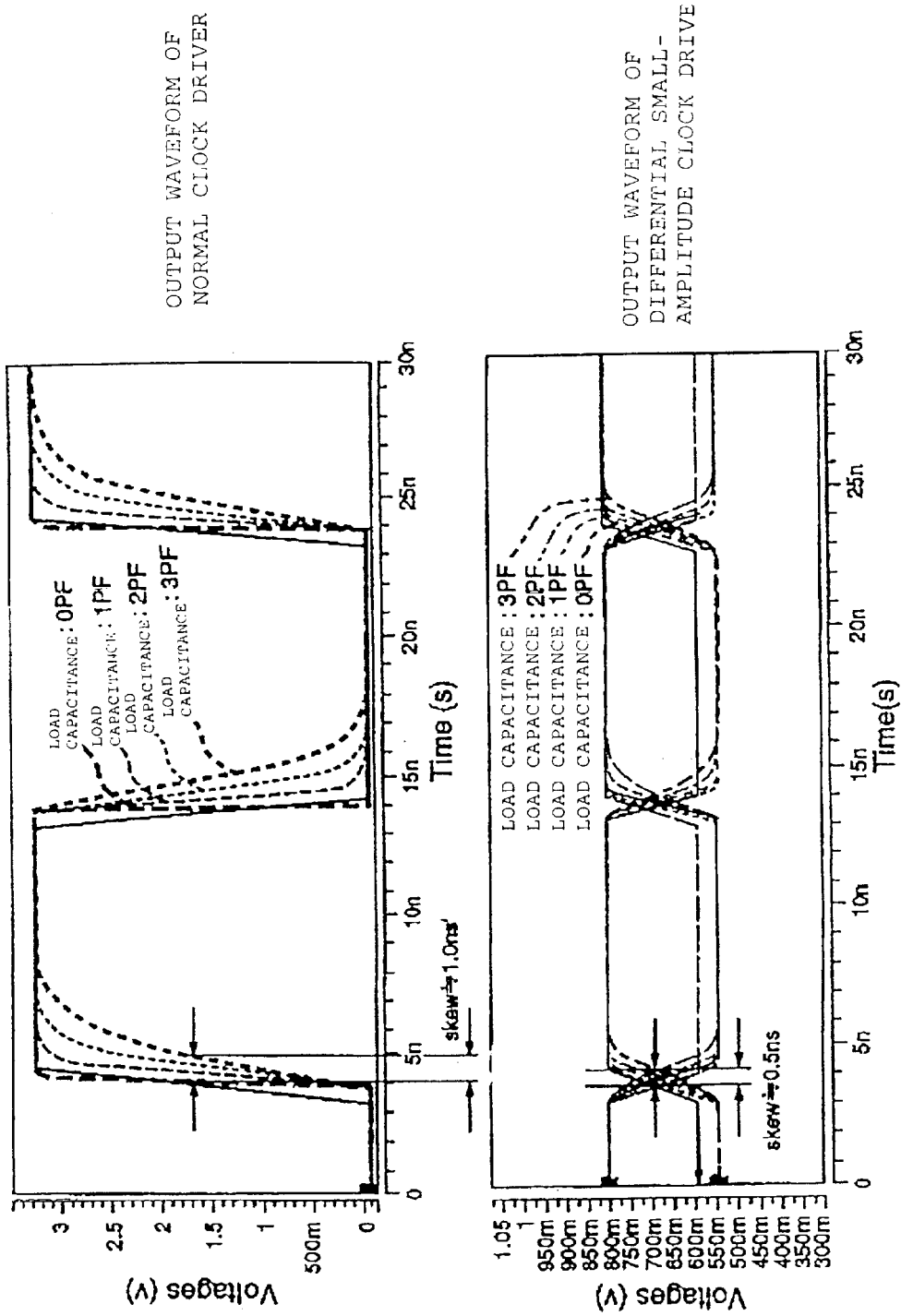
FIG. 10 is a diagram showing results of simulation obtained from comparisons of skews and load capacitance differences by a normal clock driver circuit and a differential small-amplitude clock driver circuit.

FIG. 10 is a diagram showing results of simulation obtained from comparisons of skews and load capacitance differences by a normal clock driver circuit (a) and a differential small-amplitude clock driver circuit (b). This simulation is one obtained by calculating achieved time differences with respect to load capacitance differences where a conventional clock driver circuit 1101 shown in FIG. 11 drives a variable capacitor 1102 and a clock driver circuit 1201 shown in FIG. 12, according to the present invention drives variable capacitors 1202 and 1203. The capacitance CL of each variable capacitor ranges from 0 pF to 3 pF.

Figure 11:
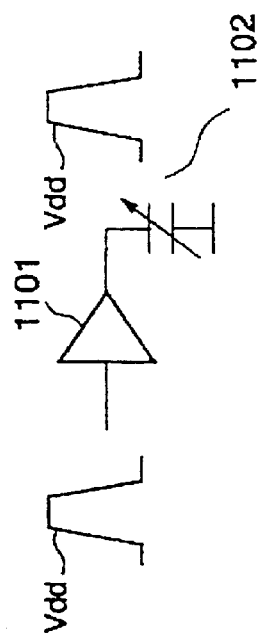
FIG. 11 is a simulation circuit diagram of a conventional clock driver circuit.
Figure 12:
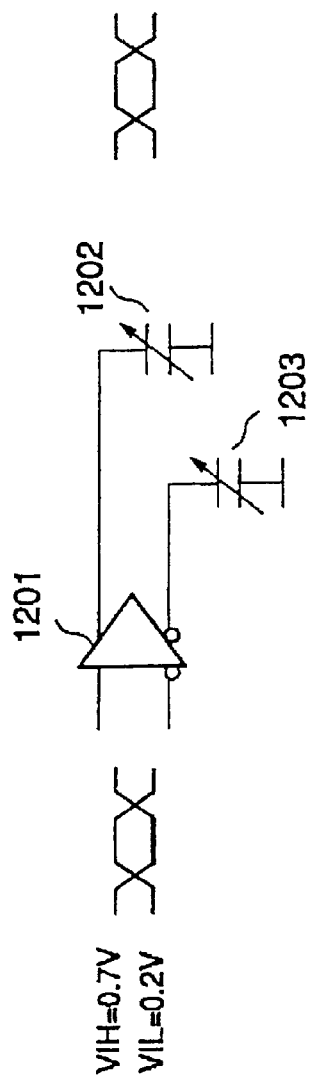
FIG. 12 is a simulation circuit diagram of a clock driver circuit according to the present invention.
Figure 13:
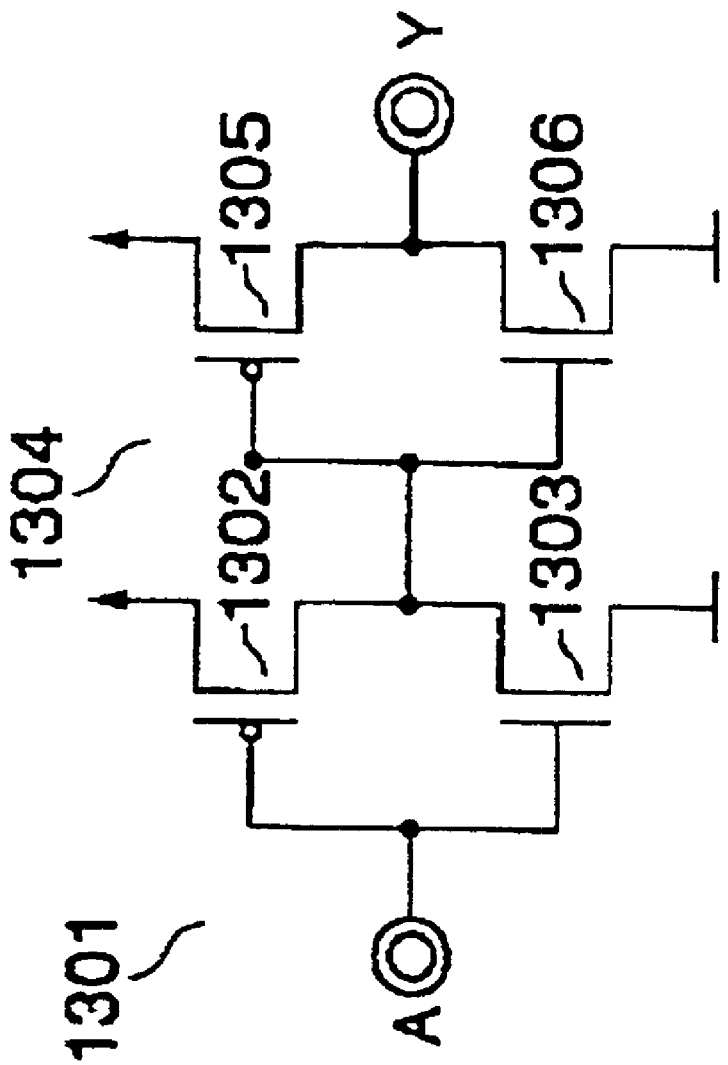
FIG. 13 is a circuit diagram of a conventional clock driver circuit 1101.

FIG. 13 is a circuit diagram of the conventional clock driver circuit 1101 shown in FIG. 11. In the same drawing, a gate length Lp of a first PMOS transistor 1302, which constitutes an input-stage inverter circuit 1301, =0.35 $\mu$m and a gate width Wp thereof=11 $\mu$m, and a gate length Ln of a first NMOS transistor 1303 constituting the input-stage inverter circuit 1301=0.35 $\mu$m and a gate width Wn thereof= 5.5 $\mu$m. Further, a gate length Lp of a second PMOS transistor 1305, which constitutes an output-stage inverter circuit 1304, =0.35 $\mu$m and a gate width Wp thereof=22 $\mu$m, and a gate length Ln of a second NMOS transistor 1306 constituting the output-stage inverter circuit 1304=0.35 $\mu$m and a gate width Wn thereof=11 $\mu$m.

Since the clock driver circuit 1201 according to the present invention is identical in circuit configuration to the clock driver circuit shown in FIG. 5, its circuit diagram will be omitted. In the clock driver circuit 1201, gate lengths Lp of all the PMOS transistors=0.35 $\mu$m and gate widths Wp thereof=20 $\mu$m, and gate lengths Ln of all the NMOS transistors=0.35 $\mu$m and gate widths Wn thereof=10 $\mu$m, respectively.

As is understood from FIG. 10, the normal clock driver circuit produces a skew of about 1 ns between load capacitances 0 pF and 3 pF, whereas the differential small-amplitude clock driver circuit produces a skew of about 0.5 ns at most. It is therefore possible to control skews with respect to variations in load capacitance.

When the clock frequency becomes high, the normal clock driver circuit increases in load capacitance to thereby make it unable to set the clock signal to the full amplitude, thus causing a risk of being unable to follow it. However, since the clock driver circuit shown in the second embodiment of the present invention is activated with small amplitude, no problem occurs even if the load capacitance increases with a high clock frequency. Further, since the differential signal is outputted and transmitted, no problem occurs in a signal receiving operation even if noise or the like is externally carried over each clock interconnect line, and noise resistance is excellent. Furthermore, power consumption based on charging and discharging currents can be controlled due to the small-amplitude operation.

Since the clock driver circuit according to the second embodiment can be easily constructed of basic cells over a gate array, an embedded array or a cell base system, it can be easily designed and implemented by a CAD system.

While the system for transmitting the differential clock signal has been introduced in the second embodiment described above, it is also feasible to supply a reference voltage to one interconnect line and transmit a clock signal through the other clock interconnect line.

While the two outputs have been described as the in-phase and anti-phase clock signals in the second embodiment, both can be also transmitted as in-phase outputs in the form of clock signals. This case produces an electromagnetic field distribution different from that shown in FIG. 3(a) and brings about the effect reducing coupling capacitance between adjacent interconnect lines. Since the corresponding interconnect lines are susceptible to other interconnect lines on the one hand, it is necessary to lay out other interconnect lines away therefrom.

According to the present invention as described above, there can be provided a clock driver circuit and a method of routing or lay out clock interconnect lines, which control the lengths of adjacent interconnect lines and ununiformity of conductive line capacitance due to the intersection of interlayer interconnect lines, thereby reducing clock skews.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A clock driver circuit formed on a single semiconductor chip, the clock driver circuit comprising:
    an input terminal receiving a single-phase clock signal;
    an initial-stage clock driver circuit electrically connected to said input terminal for converting the single-phase clock signal to a positive-phase clock signal and an anti-phase clock signal;
    an intermediate clock driver circuit for relaying the positive-phase and anti-phase clock signals output from said initial-stage clock driver circuit;
    a final-stage clock driver circuit for converting the positive-phase and anti-phase clock signals received from said intermediate clock driver circuit to a single-phase clock signal; and
    a pair of first interconnect lines connected between said initial-stage clock driver circuit and said final-stage clock driver circuit through said intermediate clock driver circuit, one of the first interconnect lines transmitting the positive-phase clock signal, the other first interconnect line transmitting the anti-phase clock signal, said interconnect lines being placed as adjacent to each other.

2. The clock driver circuit as claimed in claim 1, wherein said first interconnect lines are formed by the same conductive layer.

3. The clock driver circuit as claimed in claim 1, wherein said first interconnect lines are formed by different conductive layers provided with an insulating layer interposed therebetween.

4. The clock driver circuit as claimed in claim 1, wherein said single-phase clock signal has predetermined amplitude, and said positive-phase and anti-phase clock signals respectively have amplitude smaller than the predetermined amplitude.

5. The clock driver circuit as claimed in claim 1, wherein said first interconnect lines are surrounded by a pair of second interconnect lines to which a predetermined fixed potential is applied.

6. A clock driver circuit formed on a single semiconductor chip, the clock driver circuit comprising:
    an input terminal receiving a single-phase clock signal having a predetermined amplitude;
    an initial-stage clock driver circuit electrically connected to said input terminal for converting the single-phase clock signal to a positive-phase clock signal and an anti-phase clock signal, each of which has an amplitude small than the predetermined amplitude;
    an intermediate clock driver circuit for relaying the positive-phase and anti-phase clock signals output from said initial-stage clock driver;
    a final-stage clock driver for converting the positive-phase and anti-phase clock signals relayed by said intermediate clock driver circuit to a single-phase clock signal having a predetermined amplitude larger than the amplitude of the positive-phase and anti-phase clock signals; and
    a pair of first interconnect lines connected between said initial-stage clock driver circuit and said final-stage clock driver circuit through said intermediate clock driver circuit for transmitting the positive-phase and anti-phase clock signals.

7. The clock driver circuit as claimed in claim 6, wherein said first interconnect lines are placed as adjacent to each other.

8. The clock driver circuit as claimed in claim 7, wherein said first interconnect lines are formed by the same conductive layer.

9. The clock driver circuit as claimed in claim 7, wherein said first interconnect lines are formed by different conductive layers provided with an insulating layer interposed therebetween.

10. The clock driver circuit as claimed in claim 7, wherein said first interconnect lines are surrounded by a pair of second interconnect lines to which a predetermined fixed potential is applied.

11. The clock driver circuit as claimed in claim 6, wherein said initial-stage clock driver circuit has a clock signal receiving unit including differential amplifier circuits for respectively comparing the single-phase clock signal and a reference voltage and thereby outputting differentially amplified positive-phase and anti-phase clock signals therefrom, and a clock signal output unit for outputting the differentially amplified positive-phase and anti-phase clock signals therefrom.

12. The clock driver circuit as claimed in claim 6, wherein said intermediate clock driver circuit has a clock signal receiving unit including differential amplifier circuits for respectively comparing the positive-phase and anti-phase clock signals and outputting differentially amplified positive-phase and anti-phase clock signals therefrom, and a clock signal output unit for outputting the differentially amplified positive-phase and anti-phase clock signals therefrom.

13. The clock driver circuit as claimed in claim 6, wherein said final-stage clock driver circuit has a clock signal receiving unit including a first differential amplifier circuit for comparing the relayed positive-phase and anti-phase clock signals and outputting differentially amplified positive-phase and anti-phase clock signals therefrom, and a clock signal output unit for comparing the differentially amplified positive-phase and anti-phase clock signals, generating a differentially amplified positive-phase clock signal and outputting the generated positive-phase clock signal therefrom.

14. A method of routing clock interconnect lines, which is applied in a semiconductor integrated circuit formed on a single chip semiconductor substrate, including a logical element block having a clock input unit, comprising the steps of:

positioning an initial-stage clock driver circuit connected to an input terminal to which a single-phase clock signal is inputted, the initial-stage clock driver circuit converting the single-phase clock signal to positive-phase and anti-phase clock signals, in the neighborhood of the input terminal;

positioning an intermediate clock driver circuit which relays the positive-phase and anti-phase clock signals outputted from said initial-stage clock driver circuit;

positioning a final-stage clock driver circuit which converts the positive-phase and anti-phase clock signals relayed by the intermediate clock driver circuit to a single-phase clock signal and outputs them therefrom, in the vicinity of the clock input unit of the logical element block;

connecting said initial-stage clock driver circuit and said final-stage clock driver circuit through said intermediate clock driver circuit by a pair of interconnect lines as adjacent to each other, the interconnect lines transmitting the positive-phase and anti-phase clock signals; and positioning the other interconnect lines after the pair of interconnect lines are positioned.

15. The method as claimed in claim 14, the initial-stage clock driver circuit converts the single-phase clock signal to the positive-phase and anti-phase clock signals, each having amplitude small than the amplitude of the single-phase clock signal.

16. The method as claimed in claim 15, wherein the initial-stage clock driver circuit has a clock signal receiving unit including differential amplifier circuits for respectively comparing the single-phase clock signal and a reference voltage and thereby outputting differentially amplified positive-phase and anti-phase clock signals therefrom, and a clock signal output unit for outputting the differentially amplified positive-phase and anti-phase clock signals therefrom.

17. The method as claimed in claim 14, wherein the intermediate clock driver circuit relays the positive-phase and anti-phase clock signals outputted from the initial-stage clock driver circuit.

18. The method as claimed in claim 17, wherein the intermediate clock driver circuit has a clock signal receiving unit including differential amplifier circuits for respectively comparing the positive-phase and anti-phase clock signals and outputting differentially amplified positive-phase and anti-phase clock signals therefrom, and a clock signal output unit for outputting the differentially amplified positive-phase and anti-phase clock signals therefrom.

19. The method as claimed in claim 14, wherein the final-stage clock driver circuit converts the positive-phase and anti-phase clock signals relayed by the intermediate clock driver circuit to a single-phase clock signal having a predetermined amplitude.

20. The method as claimed in claim 19, wherein the final-stage clock driver circuit has a clock signal receiving unit including a first differential amplifier circuit for comparing the relayed positive-phase and anti-phase clock signals and outputting differentially amplified positive-phase and anti-phase clock signals therefrom, and a clock signal output unit for comparing the differentially amplified positive-phase and anti-phase clock signals, generating a differentially amplified positive-phase clock signal and outputting the generated positive-phase clock signal therefrom.

21. The method as claimed in claim 14, wherein the interconnect lines are formed adjacent to each other by the same conductive layer.

22. The method as claimed in claim 14, wherein the interconnect lines are formed by different conductive layers provided with an insulating layer interposed therebetween.

23. The method as claimed in claim 14, wherein the interconnect lines are surrounded by the other interconnect lines to which a predetermined fixed potential is applied.

* * * * *